US012574060B2

(12) United States Patent
Pehlke

(10) Patent No.: US 12,574,060 B2
(45) Date of Patent: Mar. 10, 2026

(54) FRONT-END SYSTEMS WITH ADJUSTABLE FILTER ARCHITECTURE

(71) Applicant: Skyworks Solutions, Inc., Irvine, CA (US)

(72) Inventor: David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 349 days.

(21) Appl. No.: 18/470,789

(22) Filed: Sep. 20, 2023

(65) Prior Publication Data

US 2024/0106475 A1     Mar. 28, 2024

Related U.S. Application Data

(60) Provisional application No. 63/377,144, filed on Sep. 26, 2022.

(51) Int. Cl.
| | |
|---|---|
| *H04B 1/40* | (2015.01) |
| *H03F 3/24* | (2006.01) |
| *H03H 11/04* | (2006.01) |
| *H04B 1/16* | (2006.01) |

(52) U.S. Cl.
CPC .............. *H04B 1/16* (2013.01); *H03F 3/245* (2013.01); *H03H 11/04* (2013.01); *H03F 2200/294* (2013.01); *H03F 2200/451* (2013.01); *H03H 2210/012* (2013.01)

(58) Field of Classification Search
CPC ... H04B 1/04; H04B 1/40; H04B 1/16; H04B 1/0057; H04B 3/21; H04B 3/237; H03F 3/245; H03F 2200/294; H03F 2200/451; H03F 2210/012; H03H 11/04
See application file for complete search history.

(56) References Cited

U.S. PATENT DOCUMENTS

| | | | | |
|---|---|---|---|---|
| 7,738,539 | B2 * | 6/2010 | Tudosoiu | H03F 3/24 |
| | | | | 375/267 |
| 9,397,721 | B2 | 7/2016 | Pehlke | |
| 9,748,992 | B2 | 8/2017 | Pehlke | |
| 10,069,615 | B2 | 9/2018 | Chang et al. | |
| 10,103,772 | B2 | 10/2018 | Pehlke et al. | |
| 10,374,650 | B2 | 8/2019 | Pehlke et al. | |
| 10,742,173 | B2 * | 8/2020 | Maalouf | H03F 3/195 |
| 11,671,122 | B2 | 6/2023 | Loh et al. | |
| 2013/0201882 | A1 * | 8/2013 | Bauder | H04L 25/03878 |
| | | | | 333/111 |
| 2013/0250819 | A1 * | 9/2013 | Khlat | H04L 27/0002 |
| | | | | 370/278 |

(Continued)

*Primary Examiner* — Andrew Wendell
(74) *Attorney, Agent, or Firm* — Knobbe, Martens Olson & Bear, LLP

(57) ABSTRACT

Front-end systems with an adjustable filter architecture are provided. In certain embodiments, a front-end system includes a first bandpass filter with a first passband, a second bandpass filter with a second passband, a stopband filter with a stopband, and switches for controlling connectivity of the filters along transmit and receive paths. The first passband and the second passband include a frequency overlap region, which the stopband at least partially overlaps. The re-configurability of the switches allows for the overall filtering characteristic of the adjustable filter to adjust the duplex gap between transmit and receive passband edges, as well as the passband edges themselves.

20 Claims, 14 Drawing Sheets

(56)  References Cited

U.S. PATENT DOCUMENTS

| | | | |
|---|---|---|---|
| 2017/0063411 A1* | 3/2017 | Ripley | H04B 1/1036 |
| 2017/0063412 A1* | 3/2017 | Ripley | H04B 1/18 |
| 2017/0063413 A1* | 3/2017 | Ripley | H04B 1/18 |
| 2018/0226932 A1* | 8/2018 | Beaudin | H04W 52/0261 |
| 2020/0036406 A1 | 1/2020 | Pehlke et al. | |
| 2020/0412403 A1 | 12/2020 | Pehlke et al. | |
| 2021/0098897 A1* | 4/2021 | Pehlke | H04B 1/04 |
| 2021/0181002 A1* | 6/2021 | Huang | G01L 1/205 |
| 2022/0182084 A1 | 6/2022 | King et al. | |
| 2022/0182085 A1 | 6/2022 | King et al. | |
| 2022/0385272 A1 | 12/2022 | Sun et al. | |
| 2022/0385273 A1 | 12/2022 | Sun et al. | |

* cited by examiner

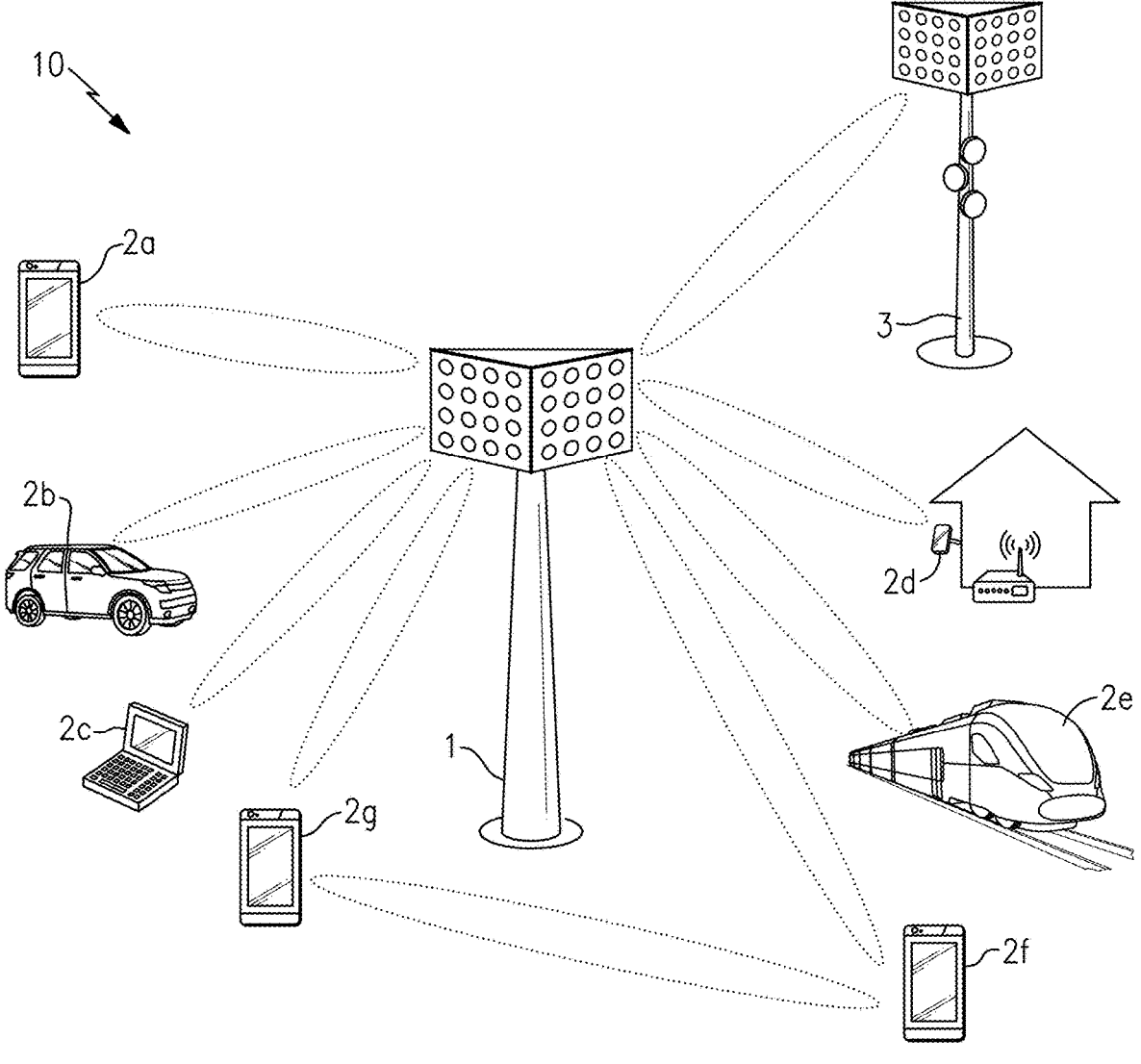
<u>FIG.1</u> mXn DL MIMO nXm UL MIMO

LARGE ATTENUATION

FRONT-END SYSTEMS WITH ADJUSTABLE FILTER ARCHITECTURE

CROSS-REFERENCE TO RELATED APPLICATIONS

This application claims the benefit of priority under 35 U.S.C. § 119 of U.S. Provisional Patent Application No. 63/377,144, filed Sep. 26, 2022 and titled "FRONT-END SYSTEMS WITH ADJUSTABLE FILTER ARCHITEC-TURE," which is herein incorporated by reference in its entirety.

BACKGROUND

Field

Embodiments of the invention relate to electronic systems, and in particular, to radio frequency electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes an antenna, and a front-end system including an adjustable filter, a power amplifier, and a low noise amplifier. The adjustable filter includes a first multi-throw switch having an antenna terminal connected to the antenna and a second multi-throw switch having a transmit terminal connected to an output of the power amplifier and a receive terminal connected to an input of the low noise amplifier. The adjustable filter further includes a first bandpass filter connected between a first filter terminal of the first multi-throw switch and a first filter terminal of the second multi-throw switch, a second band-pass filter connected between a second filter terminal of the first multi-throw switch and a second filter terminal of the second multi-throw switch, and a stopband filter connected between the first filter terminal of the first multi-throw switch and the second filter terminal of the first multi-throw switch.

In various embodiments, a first passband of the first bandpass filter overlaps a second passband of the second bandpass filter in a frequency overlap region. According to a number of embodiments, a stopband of the stopband filter at least partially overlaps the frequency overlap region.

In several embodiments, a state of the second multi-throw switch is operable to control signal transmission or reception for time-division duplexing.

In various embodiments, the adjustable filter is operable in a first mode in which the first multi-throw switch selects the first filter terminal and the second multi-throw switch selects the first filter terminal, and a second mode in which the first multi-throw switch selects the second filter terminal and the second multi-throw switch selects the second filter terminal. According to a number of embodiments, the adjustable filter is operable in a third mode in which the first multi-throw switch selects the second filter terminal and the second multi-throw switch selects the first filter terminal, and a fourth mode in which the first multi-throw switch selects the first filter terminal and the second multi-throw switch selects the second filter terminal. In accordance with several embodiments, the adjustable filter is operable in a fifth mode in which the first multi-throw switch selects the first filter terminal and the second multi-throw switch selects both the first filter terminal and the second filter terminal, and a sixth mode in which the first multi-throw switch selects the second filter terminal and the second multi-throw switch selects both the first filter terminal and the second filter terminal.

In certain embodiments, the present disclosure relates to a method of adjustable filtering in a mobile device. The method includes providing a transmit signal from an output of a power amplifier to an antenna by way of an adjustable filter and receiving a receive signal from an antenna at an input of a low noise amplifier by way of the adjustable filter. The method further includes controlling a state of a first multi-throw switch of the adjustable filter that is connected to the antenna, the adjustable filter including a first bandpass filter connected to a first filter terminal of the first multi-throw switch, a second bandpass filter connected to a second filter terminal of the first multi-throw switch, and a stopband filter connected between the first filter terminal and the second filter terminal. The method further includes controlling a state of a second multi-throw switch of the adjustable filter, the second multi-throw switch having a first filter terminal connected to the first bandpass filter, a second filter terminal connected to the second bandpass filter, a transmit terminal connected to an output of the power amplifier, and a receive terminal connected to an input of the low noise amplifier.

In several embodiments, a first passband of the first bandpass filter overlaps a second passband of the second bandpass filter in a frequency overlap region. According to a number of embodiments, the method further includes controlling a state of the second multi-throw switch to control signal transmission or reception for time-division duplexing.

In various embodiments, the method further includes operating the adjustable filter in a first mode in which the first multi-throw switch selects the first filter terminal and the second multi-throw switch selects the first filter terminal, and operating the adjustable filter in a second mode in which the first multi-throw switch selects the second filter terminal and the second multi-throw switch selects the second filter terminal. According to a number of embodiments, the method further includes operating the adjustable filter in a third mode in which the first multi-throw switch selects the second filter terminal and the second multi-throw switch selects the first filter terminal, and operating the adjustable filter in a fourth mode in which the first multi-throw switch selects the first filter terminal and the second multi-throw switch selects the second filter terminal. In accordance with some embodiments, the method further includes operating the adjustable filter in a fifth mode in which the first multi-throw switch selects the first filter terminal and the second multi-throw switch selects both the first filter termi-nal and the second filter terminal, and operating the adjustable filter in a sixth mode in which the first multi-throw switch selects the second filter terminal and the second multi-throw switch selects both the first filter terminal and the second filter terminal.

In certain embodiments the present disclosure relates to a front-end system. The front-end system includes a power amplifier having an output, a low noise amplifier having an input, and an adjustable filter including a first multi-throw switch having an antenna terminal for connecting to an antenna and a second multi-throw switch having a transmit terminal connected to the output of the power amplifier and a receive terminal connected to the input of the low noise amplifier. The adjustable filter further includes a first bandpass filter connected between a first filter terminal of the first multi-throw switch and a first filter terminal of the second multi-throw switch, a second bandpass filter connected between a second filter terminal of the first multi-throw switch and a second filter terminal of the second multi-throw switch, and a stopband filter connected between the first filter terminal of the first multi-throw switch and the second filter terminal of the first multi-throw switch.

In some embodiments, a first passband of the first bandpass filter overlaps a second passband of the second bandpass filter in a frequency overlap region. According to a number of embodiments, a stopband of the stopband filter at least partially overlaps the frequency overlap region.

In various embodiments, a state of the second multi-throw switch is operable to control signal transmission or reception for time-division duplexing.

In several embodiments, the adjustable filter is operable in a first mode in which the first multi-throw switch selects the first filter terminal and the second multi-throw switch selects the first filter terminal, and a second mode in which the first multi-throw switch selects the second filter terminal and the second multi-throw switch selects the second filter terminal. According to some embodiments, the adjustable filter is operable in a third mode in which the first multi-throw switch selects the second filter terminal and the second multi-throw switch selects the first filter terminal, and a fourth mode in which the first multi-throw switch selects the first filter terminal and the second multi-throw switch selects the second filter terminal. In accordance with various embodiments, the adjustable filter is operable in a fifth mode in which the first multi-throw switch selects the first filter terminal and the second multi-throw switch selects both the first filter terminal and the second filter terminal, and a sixth mode in which the first multi-throw switch selects the second filter terminal and the second multi-throw switch selects both the first filter terminal and the second filter terminal.

In certain embodiments, the present disclosure relates to a mobile device. The mobile device includes an antenna and a front-end system including an adjustable filter, a power amplifier, and a low noise amplifier. The adjustable filter includes a transmit switch having a transmit terminal connected to an output of the power amplifier, a receive switch having a receive terminal connected to an input of the low noise amplifier, a multi-throw switch having an antenna terminal coupled to the antenna, a transmit bandpass filter connected between a first filter terminal of the multi-throw switch and a filter terminal of the transmit switch, a receive bandpass filter connected between a second filter terminal of the multi-throw switch and a filter terminal of the receive switch, and a stopband filter connected between the first filter terminal and the second filter terminal.

In some embodiments, a first passband of the transmit bandpass filter overlaps a second passband of the receive bandpass filter in a frequency overlap region. According to a number of embodiments, a stopband of the stopband filter at least partially overlaps the frequency overlap region.

In several embodiments, the front-end system operates using frequency-division duplexing.

In various embodiments, the adjustable filter is operable in a first mode in which the multi-throw switch selects the first filter terminal for connecting to the antenna, and a second mode in which the multi-throw switch selects the second filter terminal for connecting to the antenna. According to a number of embodiments, the adjustable filter is operable in a third mode in which the multi-throw switch decouples the stopband filter from the first filter terminal and the second filter terminal.

In some embodiments, the front-end system further includes a switchable shunt inductor connected to one of the first filter terminal or the second filter terminal. According to a number of embodiments, the switchable shunt inductor has a controllable inductance value.

In certain embodiments, the present disclosure relates to a method of adjustable filtering in a mobile device. The method includes providing a transmit signal from an output of a power amplifier to an antenna by way of an adjustable filter, receiving a receive signal from an antenna at an input of a low noise amplifier by way of the adjustable filter, controlling a state of a transmit switch of the adjustable filter, the transmit switch having a transmit terminal connected to the output of the power amplifier, controlling a state of a receive switch of the adjustable filter, the receive switch having a receive terminal connected to the input of the low noise amplifier, controlling a state of a multi-throw switch of the adjustable filter, the multi-throw switch having an antenna terminal coupled to the antenna, and providing filtering using the adjustable filter, the adjustable filter including a transmit bandpass filter connected between a first filter terminal of the multi-throw switch and a filter terminal of the transmit switch, a receive bandpass filter connected between a second filter terminal of the multi-throw switch and a filter terminal of the receive switch, and a stopband filter connected between the first filter terminal and the second filter terminal.

In various embodiments, a first passband of the transmit bandpass filter overlaps a second passband of the receive bandpass filter in a frequency overlap region. According to a number of embodiments, a stopband of the stopband filter at least partially overlaps the frequency overlap region.

In various embodiments, the method further includes controlling a switchable shunt inductor connected to one of the first filter terminal or the second filter terminal.

In certain embodiments, the present disclosure relates to a front-end system. The front-end system further includes a power amplifier having an output, a low noise amplifier having an input, and an adjustable filter including a transmit switch having a transmit terminal connected to the output of the power amplifier, a receive switch having a receive terminal connected to the input of the low noise amplifier, a multi-throw switch having an antenna terminal for coupling to an antenna, a transmit bandpass filter connected between a first filter terminal of the multi-throw switch and a filter terminal of the transmit switch, a receive bandpass filter connected between a second filter terminal of the multi-throw switch and a filter terminal of the receive switch, and a stopband filter connected between the first filter terminal and the second filter terminal.

In various embodiments, a first passband of the transmit bandpass filter overlaps a second passband of the receive bandpass filter in a frequency overlap region. According to a number of embodiments, a stopband of the stopband filter at least partially overlaps the frequency overlap region.

In several embodiments, the front-end system operates using frequency-division duplexing.

In various embodiments, the adjustable filter is operable in a first mode in which the multi-throw switch selects the first filter terminal, and a second mode in which the multi-throw switch selects the second filter terminal. According to a number of embodiments, the adjustable filter is operable in a third mode in which the multi-throw switch decouples the stopband filter from the first filter terminal and the second filter terminal.

In several embodiments, the front-end system further includes a switchable shunt inductor connected to one of the first filter terminal or the second filter terminal. According to several embodiments, the switchable shunt inductor has a controllable inductance value.

BRIEF DESCRIPTION OF THE DRAWINGS

FIG. 1 is a schematic diagram of one example of a communication network.

DETAILED DESCRIPTION OF EMBODIMENTS

Figure 2A:
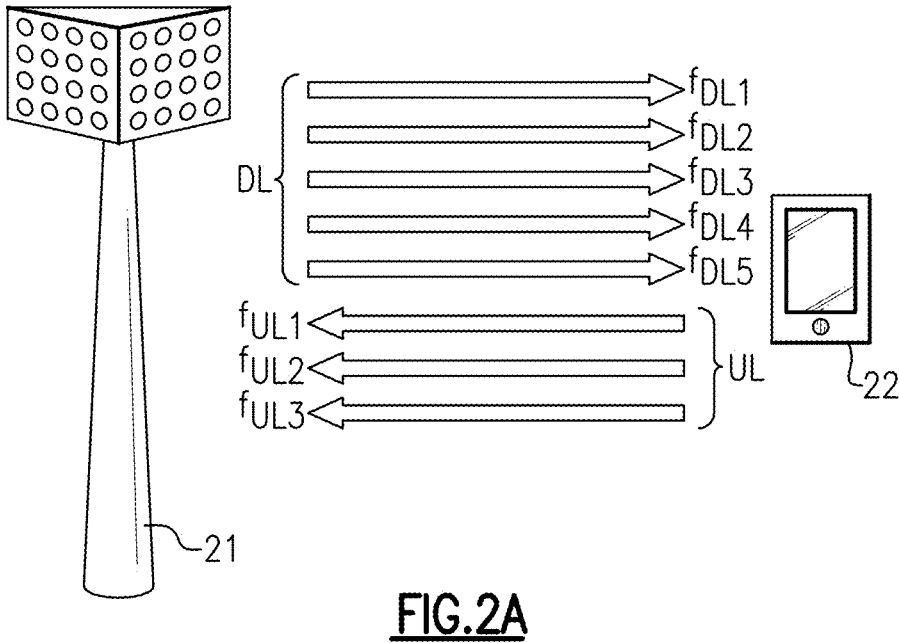
FIG. 2A is a schematic diagram of one example of a communication link using carrier aggregation.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3 GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user.

Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
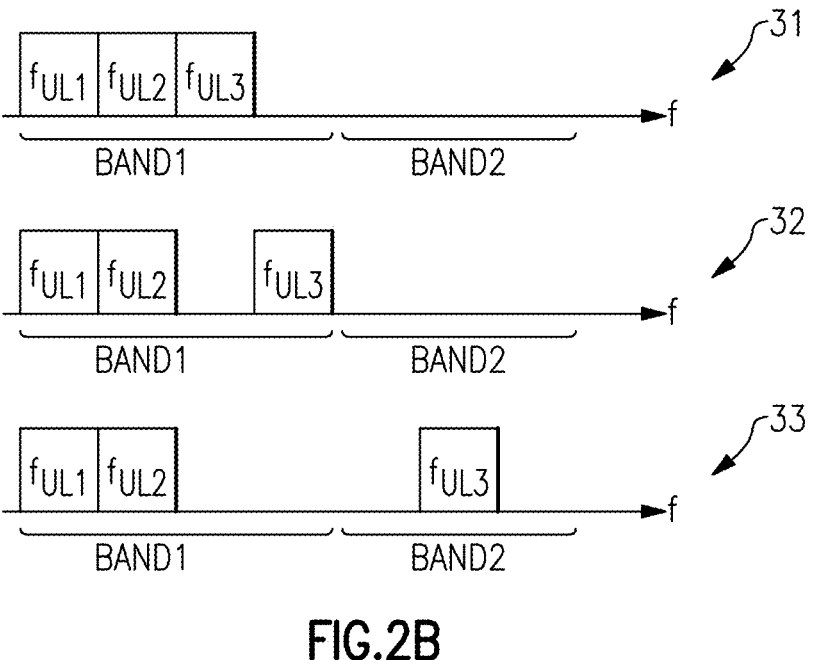
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
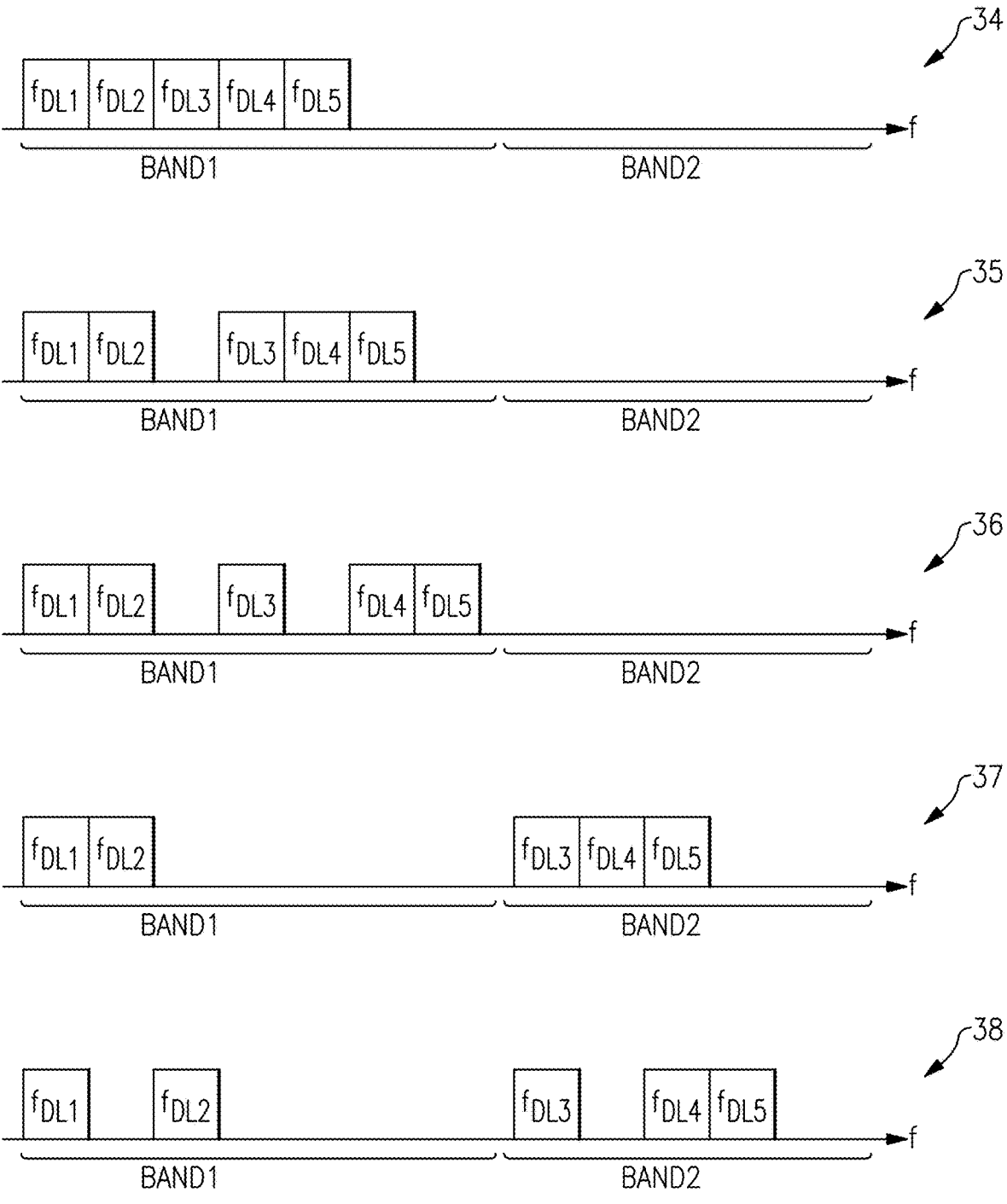
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and second cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
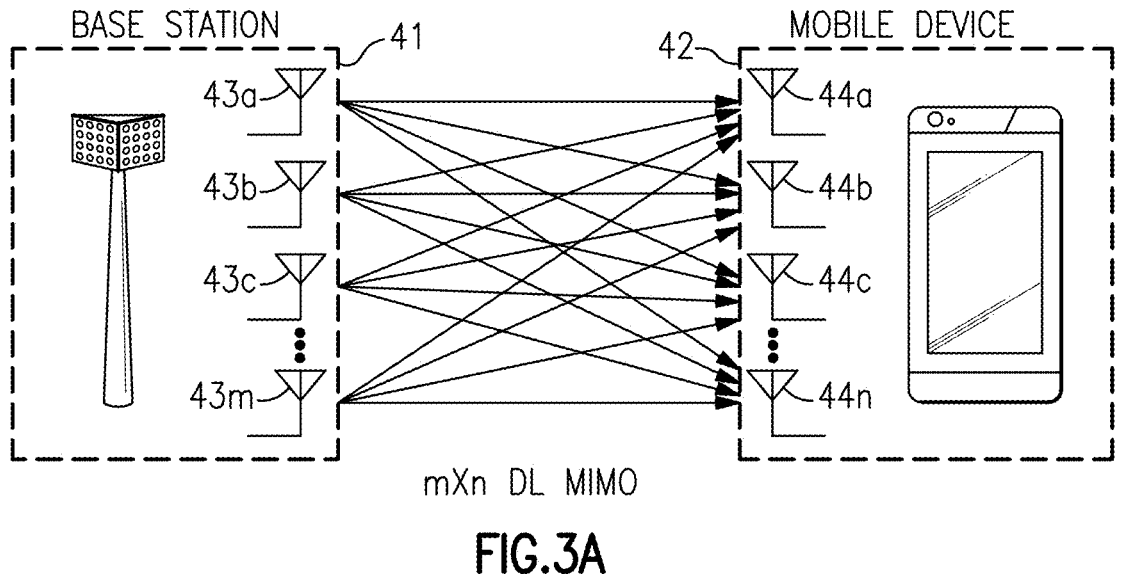
FIG. 3A is a schematic diagram of one example of a downlink channel using multi-input and multi-output (MIMO) communications.
Figure 3B:
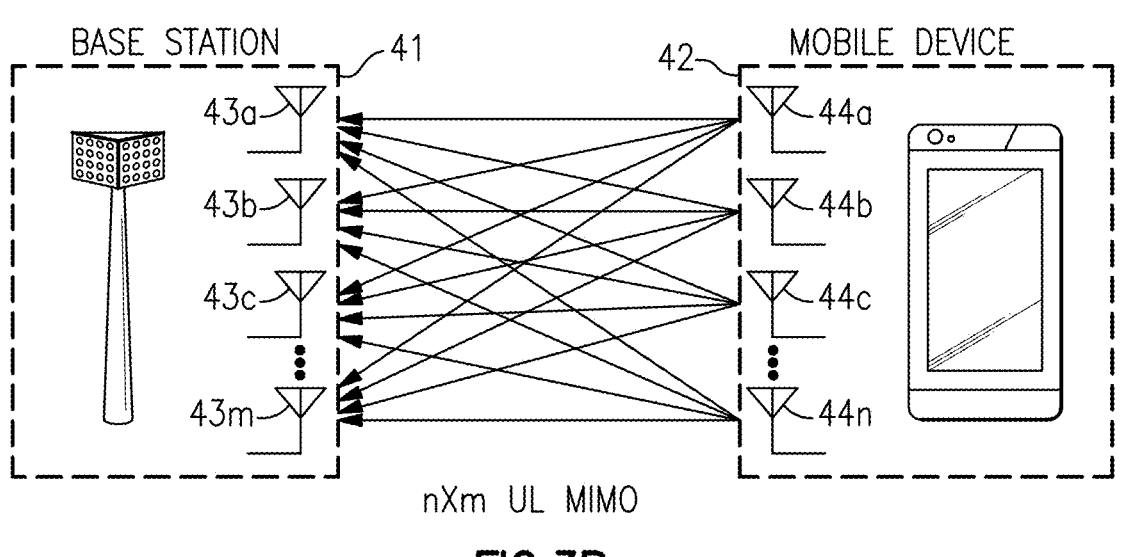
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
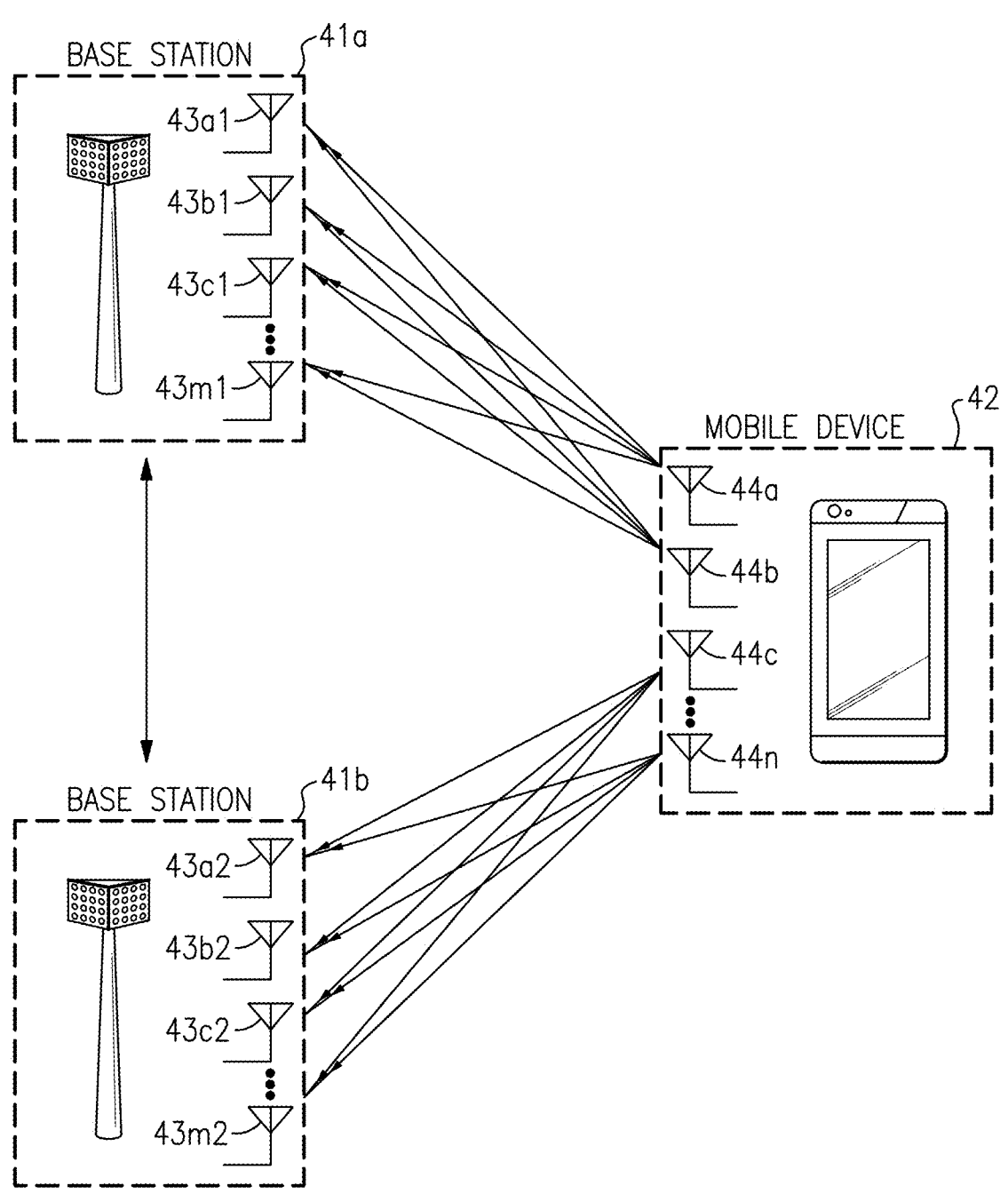
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

Figure 4:
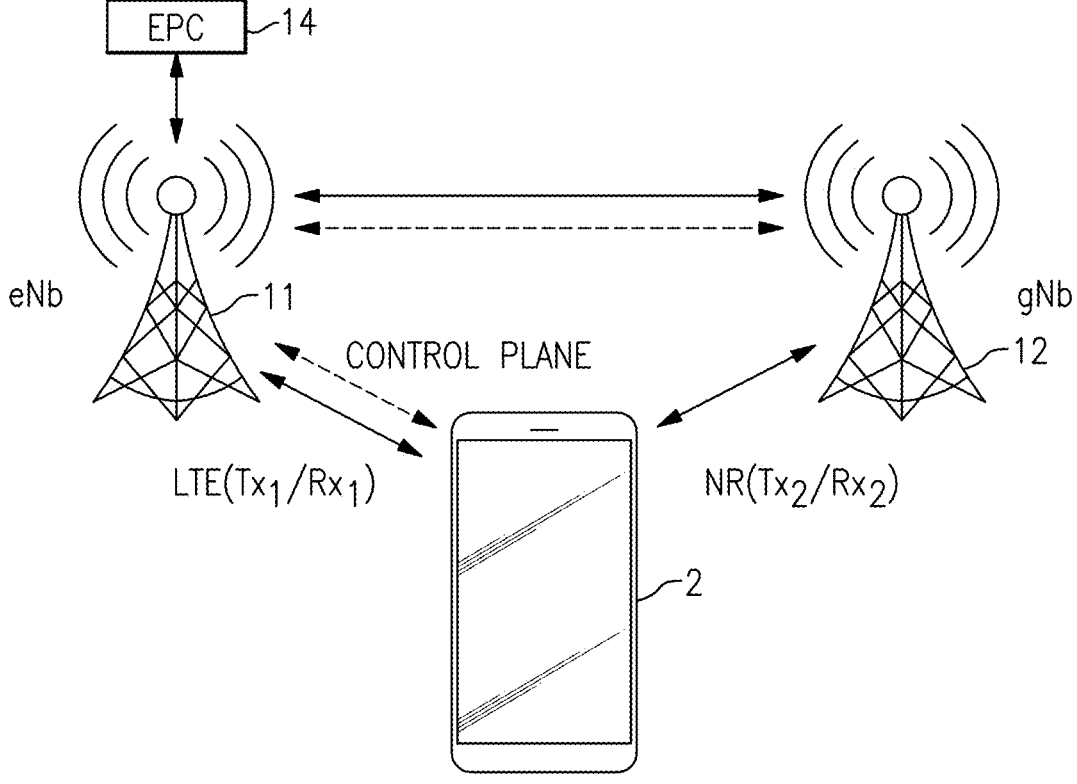
FIG. 4 is a schematic diagram of an example dual connectivity network topology.

FIG. 4 is a schematic diagram of an example dual connectivity network topology. This architecture can leverage LTE legacy coverage to ensure continuity of service delivery and the progressive rollout of 5G cells. A UE 2 can simultaneously transmit dual uplink LTE and NR carrier. The UE 2 can transmit an uplink LTE carrier Tx1 to the eNB 11 while transmitting an uplink NR carrier Tx2 to the gNB 12 to implement dual connectivity. Any suitable combination of uplink carriers Tx1, Tx2 and/or downlink carriers Rx1, Rx2 can be concurrently transmitted via wireless links in the example network topology of FIG. 1. The eNB 11 can provide a connection with a core network, such as an Evolved Packet Core (EPC) 14. The gNB 12 can communicate with the core network via the eNB 11. Control plane data can be wireless communicated between the UE 2 and eNB 11. The eNB 11 can also communicate control plane data with the gNB 12. Control plane data can propagate along the paths of the dashed lines in FIG. 4. The solid lines in FIG. 4 are for data plane paths.

In the example dual connectivity topology of FIG. 4, any suitable combinations of standardized bands and radio access technologies (e.g., FDD, TDD, SUL, SDL) can be wirelessly transmitted and received. This can present technical challenges related to having multiple separate radios and bands functioning in the UE 2. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

As discussed above, EN-DC can involve both 4G and 5G carriers being simultaneously transmitted from a UE. Transmitting both 4G and 5G carriers in a UE, such as a phone, typically involves two power amplifiers (PAs) being active at the same time. Traditionally, having two power amplifiers active simultaneously would involve the placement of one or more additional power amplifiers specifically suited for EN-DC operation. Additional board space and expense is incurred when designing to support such EN-DC/NSA operation.

Figure 5A:
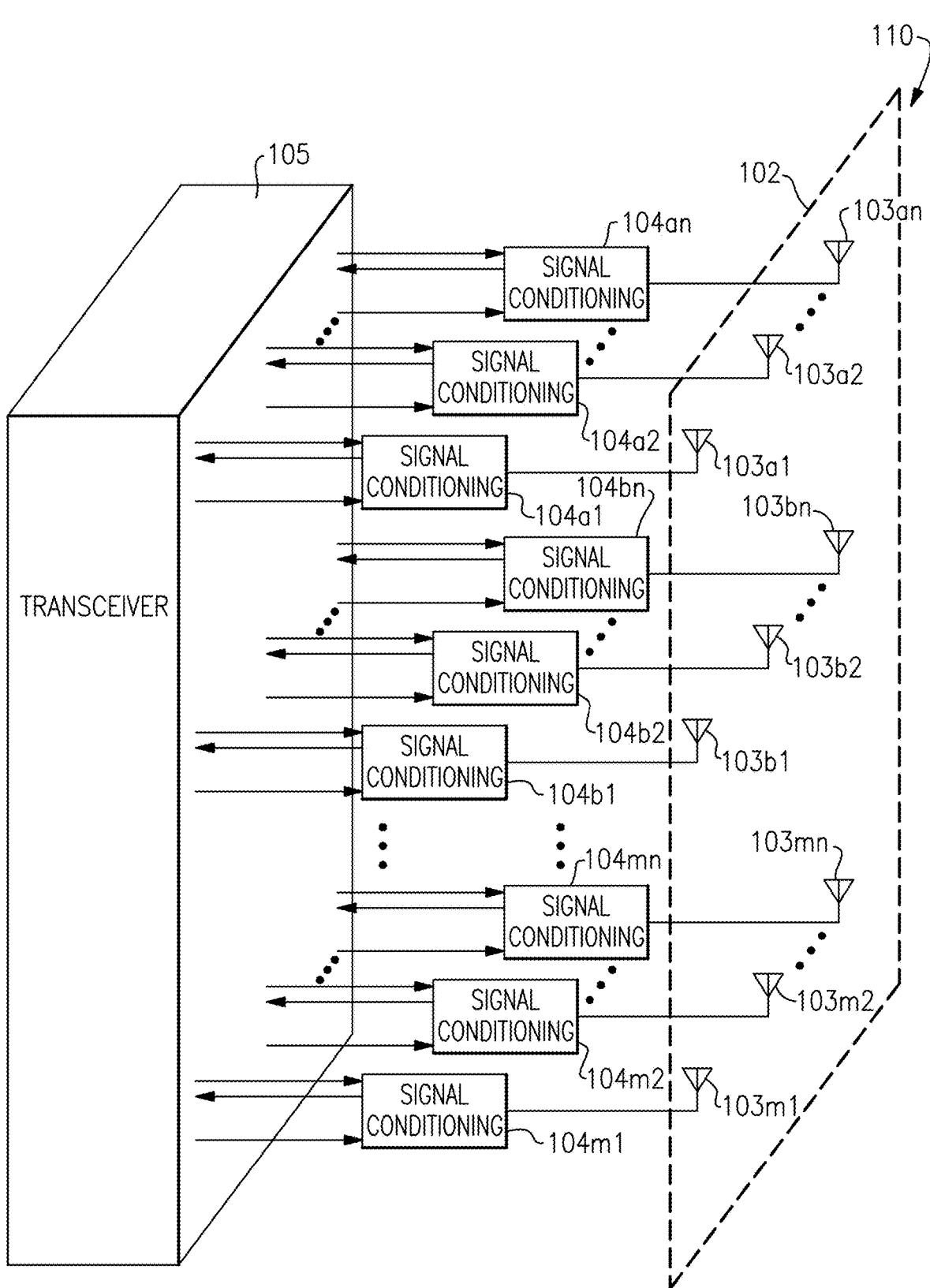
FIG. 5A is a schematic diagram of one example of a communication system that operates with beamforming.

FIG. 5A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 5A, the transceiver 105 generates control signals for the signal conditioning circuits. The control signals can be used for a variety of functions, such as controlling the gain and phase of transmitted and/or received signals to control beamforming.

Figure 5B:
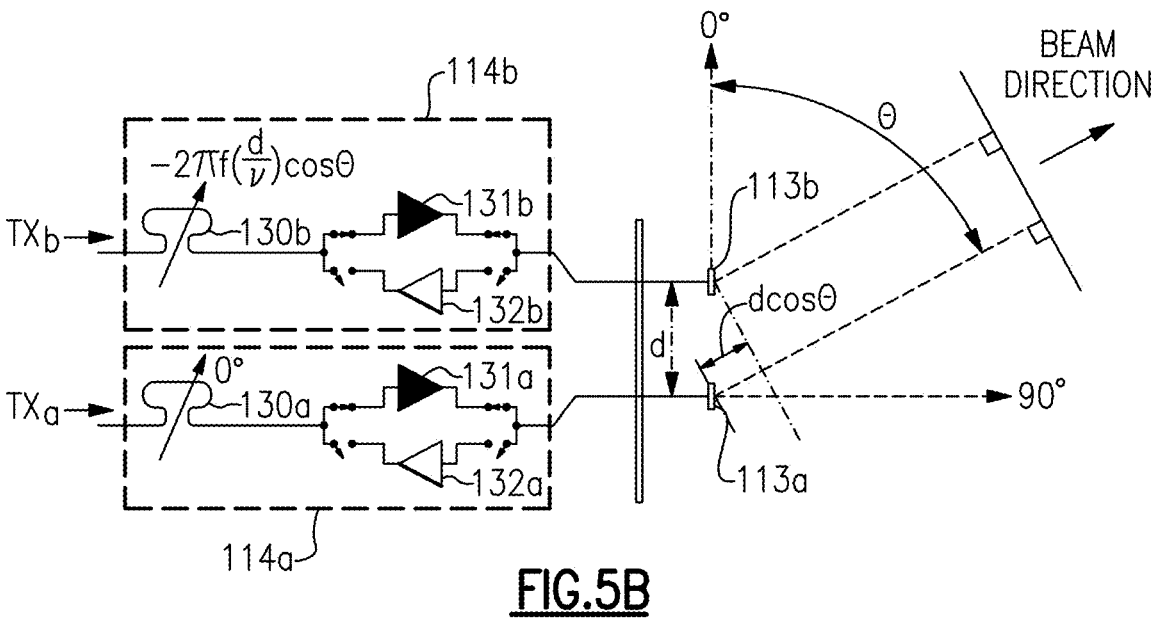
FIG. 5B is a schematic diagram of one example of beamforming to provide a transmit beam.

FIG. 5B is a schematic diagram of one example of beamforming to provide a transmit beam. FIG. 5B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 5B illustrates one embodiment of a portion of the communication system 110 of FIG. 5A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 5B has been annotated with an angle Θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle Θ can be achieved. For example, when the first phase shifter 130a has a reference value of 0°, the second phase shifter 130b can be controlled to provide a phase shift of about $-2\pi f(d/v)\cos\Theta$ radians, where f is the fundamental frequency of the transmit signal, d is the distance between the antenna elements, v is the velocity of the radiated wave, and $\pi$ is the mathematic constant pi.

In certain implementations, the distance d is implemented to be about $\frac{1}{2}\lambda$, where $\lambda$ is the wavelength of the fundamental component of the transmit signal. In such implementations, the second phase shifter 130b can be controlled to provide a phase shift of about $-\pi\cos\Theta$ radians to achieve a transmit beam angle Θ.

Accordingly, the relative phase of the phase shifters 130a, 130b can be controlled to provide transmit beamforming. In certain implementations, a baseband processor and/or a transceiver (for example, the transceiver 105 of FIG. 5A) controls phase values of one or more phase shifters and gain values of one or more controllable amplifiers to control beamforming.

Figure 5C:
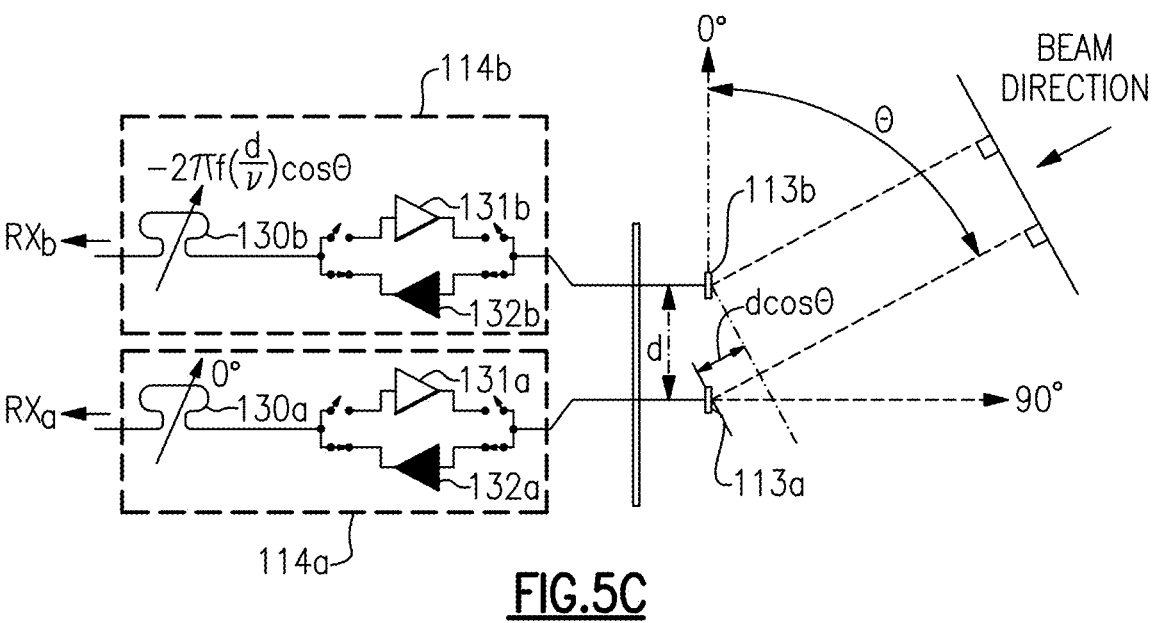
FIG. 5C is a schematic diagram of one example of beamforming to provide a receive beam.

FIG. 5C is a schematic diagram of one example of beamforming to provide a receive beam. FIG. 5C is similar to FIG. 5B, except that FIG. 5C illustrates beamforming in the context of a receive beam rather than a transmit beam.

As shown in FIG. 5C, a relative phase difference between the first phase shifter 130a and the second phase shifter 130b can be selected to about equal to $-2\pi f(d/v)\cos\Theta$ radians to achieve a desired receive beam angle Θ. In implementations in which the distance d corresponds to about $\frac{1}{2}\lambda$, the phase difference can be selected to about equal to $-\pi\cos\Theta$ radians to achieve a receive beam angle Θ.

Although various equations for phase values to provide beamforming have been provided, other phase selection values are possible, such as phase values selected based on implementation of an antenna array, implementation of signal conditioning circuits, and/or a radio environment.

Certain RF front-end designs are based on fixed acoustic filters with high quality-factor (Q-factor) providing steep attenuation for high selectivity within fixed passband frequency ranges. In such configurations, tunability of the front-end support is achieved by programmable switched selection of one of several different fixed frequency paths.

Existing time division duplex (TDD) operation and corresponding RF path design is focused on alternating transmit and receive operation on the same channel frequency.

Such TDD systems can operate through a common bandpass filter despite differing amounts of out-of-band attenuation for changing channel placement, power amplitude, inter-channel concurrency, inter-radio access technology (inter-RAT) concurrency, and/or coexistence conditions.

Some of these operating scenarios will present much more challenging self-desense and/or regulatory radiated emissions requirements, yet because of the lack of adjustability, the front-end is designed for the worst case. Thus, the front-end is overdesigned for most other cases, and suffers more insertion loss and/or other penalties in the fixed filter solution than needed for those particular use cases.

For frequency division duplex (FDD) operation, in which both transmit and receive are concurrently operated at different channel frequencies, the filter topology should provide very high levels of isolation between transmit and receive. Each filter is designed to enable low insertion loss in the passband, and large out-of-band attenuation in the range of frequency for the paired passband in order to present an open-circuit and reduce loading and insertion loss degradation. Compounding this isolation requirement between transmit and receive are receive desense and/or radiated emissions specifications that vary depending on channel placement, power amplitude, inter-channel concurrency, inter-RAT concurrency, and/or coexistence conditions.

As disclosed in certain embodiments herein, tunability of the duplex gap between transmit and receive passband edges, as well as the passband edges themselves offers more flexibility to improve performance and/or cost consolidate the front-end radio design.

For example, in some embodiments, an adjustable filter for a front-end system operating using TDD is provided. The front-end system includes a first bandpass filter with a first passband ($B_A$), a second bandpass filter with a second passband ($B_B$), a stopband filter with a stopband ($B_C$), and switches for controlling connectivity of the filters along TDD transmit and receive paths. The first passband ($B_A$) and the second passband ($B_B$) include a frequency overlap region, which the stopband ($B_C$) at least partially (and in some implementations, fully) overlaps. The re-configurability of the switches allows for the overall filtering characteristic of the adjustable filter to adjust the duplex gap between transmit and receive passband edges, as well as the passband edges themselves.

Moreover, by reducing the loading of the open circuited switch throws, flexible changes in connectivity offer tunability.

In certain implementations, the switches are configurable such that the stopband filter is: (1) not switched in and the first passband ($B_A$) is selected for transmit and receive in a first mode; (2) not switched in and the second passband ($B_B$) is selected for transmit and receive in a second mode; (3) switched in and connected in series with the first bandpass filter (with passband $B_A$) to effectively reduce the first bandpass filter's passband bandwidth in a third mode; and (4) switched in and connected in series with the second bandpass filter (with passband $B_B$) to effectively reduce the second bandpass filter's passband bandwidth in a fourth mode.

Furthermore, in certain implementations, the switches are further configurable such that the stopband filter is: (5) switched in series with the second bandpass filter (with passband $B_B$) and connected in duplex with first bandpass filter (with passband $B_A$) forming a type of extractor of two pass bands separated by a stopband in a fifth mode; and (6) switched in series with the first bandpass filter (with passband $B_A$) and connected in duplex with the second bandpass filter (with passband $B_B$) forming a type of extractor of two pass bands separated by a stopband in a sixth mode.

By reconfiguring the switches, the band edges and a stopband within frequency extents can be made switch programmable and adjustable.

In other embodiments, an adjustable filter for a front-end system operating using FDD is provided. The front-end system includes a first bandpass filter with a first passband (Tx), a second bandpass filter with a second passband (Rx), a stopband filter with a stopband ($B_C$), and switches for controlling connectivity of the filters along FDD transmit and receive paths.

With respect to FDD, one challenge is that the filter passbands of duplexers (n-plexers more generally, also referred to as multiplexers) should not overlap while also providing high impedance open-circuit when in connection with the paired passbands to avoid loading and/or insertion loss degradations.

The re-configurability of the filters allows connection of the stopband filter to enable such n-plexing (also referred to as multiplexing).

In certain implementations, the switches are configured such that the stopband filter can be: (1) placed in series with the first bandpass filter (with passband Tx) in the transmit path and not present in the receive path in a first mode; or (2) placed in series with the second bandpass filter (with passband Rx) in the receive path and not present in the transmit path in a second mode.

Moreover, in certain embodiments, the switches are further configured to selectively decouple (either connect in or not) the stopband filter (with stopband $B_C$) in further mode(s).

Furthermore, in certain implementations, switchable shunt inductors are included at common points of the duplex filter common connection that can be switched in (or not) and of programmable value by switching in different values to further enhance the multiplexer performance. For example, such switchable shunt inductors can be placed at the terminals of a multi-throw switch and/or filter.

Figure 6A:
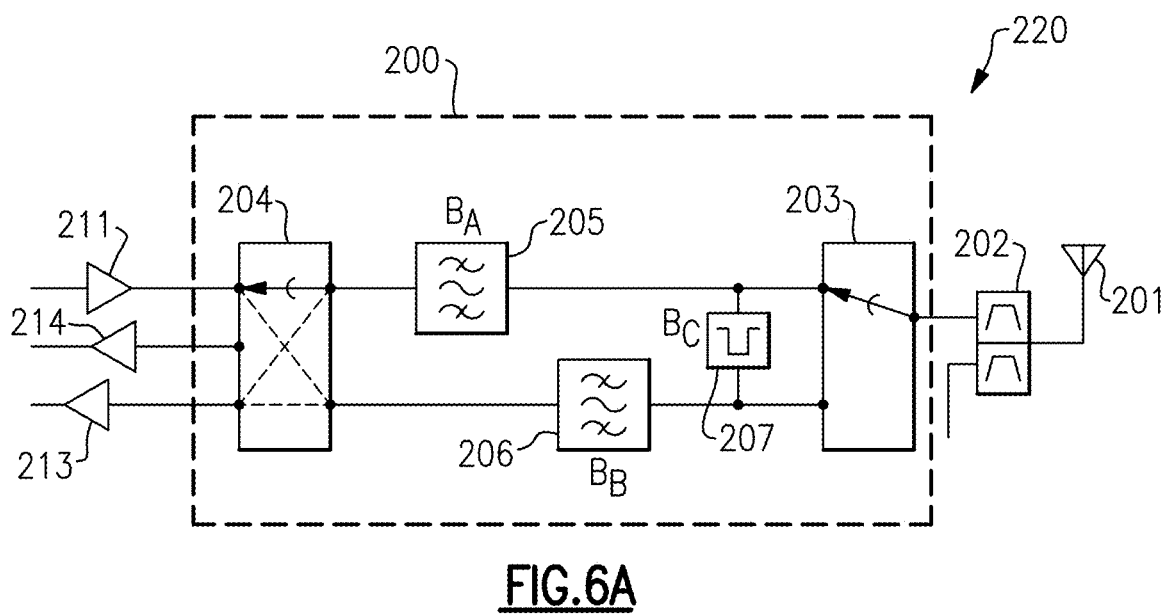
FIG. 6A is a schematic diagram of a front-end system with an adjustable filter according to one embodiment.

FIG. 6A is a schematic diagram of a front-end system 220 according to one embodiment. The front-end system 220 is coupled to an antenna 201, and includes an adjustable filter 200, an antenna-plexer 202 (implemented as a diplexer, in this example), a power amplifier 211, a first LNA 213, and a second LNA 214. The front-end system 220 operates using TDD.

Figure 6B:
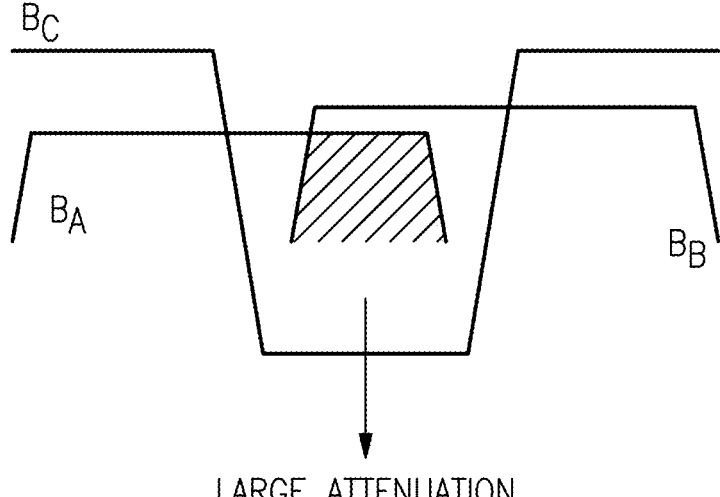
FIG. 6B is one example of a gain versus frequency diagram for the adjustable filter of FIG. 6A.

The adjustable filter 200 includes a first multi-throw switch 203 (also referred to as an antenna switch or ASM), a second multi-throw switch 204, a first bandpass filter 205 with a first passband ($B_A$), a second bandpass filter 206 with a second passband ($B_B$), and a stopband filter 207 with a stopband ($B_C$). FIG. 6B is one example of a gain versus frequency diagram for the adjustable filter of FIG. 6A. As shown in FIG. 6B, in certain implementations the first passband ($B_A$) and the second passband ($B_B$) include a frequency overlap region (indicated in FIG. 6B by a hatched pattern), which the stopband ($B_C$) overlaps.

In the illustrated embodiment, the first multi-throw switch 203 includes an antenna terminal for connecting to the antenna 201 (through a diplexer, in this example). The first multi-throw switch 203 also includes a first filter terminal and a second filter terminal each of which can be selected to connect to the antenna terminal based on a state of the first multi-throw switch 203.

With continuing reference to FIGS. 6A and 6B, the second multi-throw switch 204 includes a transmit terminal for connecting to an output of the power amplifier 211, and a receive terminal for connecting to an input of the first LNA 213. The second multi-throw switch 204 can also include additional transmit and/or receive terminals, for instance, a second receive terminal for connecting to an input of the second LNA 213. Any desired number of transmit and receive terminals can be included. The second multi-throw switch 204 also includes a first filter terminal and a second filter terminal that can be connected to the transmit and/or receive terminal(s) as desired based on a state of the second multi-throw switch 204. Any suitable circuit, such as a control circuit programmed over an interface by a transceiver, can be used to set the state of the switches of an adjustable filter.

As shown in FIG. 6A, the stopband filter 207 is connected between the first filter terminal and the second filter terminal of the first multi-throw switch 203. Additionally, the first bandpass filter 205 is connected between the first filter terminal of the first multi-throw switch 203 and the first filter terminal of the second multi-throw switch 204. Furthermore, the second bandpass filter 206 is connected between the second filter terminal of the first multi-throw switch 203 and the second filter terminal of the second multi-throw switch 204.

The depicted configuration of filters and switches enables TDD operation in which the adjustable filter 200 can adjust the duplex gap between transmit and receive passband edges, as well as the passband edges themselves.

In certain implementations, the switches 203/204 are configurable such that the stopband filter 207 is: (1) not switched in and the first passband ($B_A$) is selected for transmit and receive in a first mode; (2) not switched in and the second passband ($B_B$) is selected for transmit and receive in a second mode; (3) switched in and connected in series with the first bandpass filter (with passband $B_A$) to effectively reduce the first bandpass filter's passband bandwidth in a third mode; and (4) switched in and connected in series with the second bandpass filter (with passband $B_B$) to effectively reduce the second bandpass filter's passband bandwidth in a fourth mode.

For example, in the first mode, the first multi-throw switch 203 can be set to connect the antenna terminal to the first filter terminal, while the second multi-throw switch 204 can connect the first filter terminal to the transmit terminal or the receive terminal as needed for TDD operation. Thus, the first passband ($B_A$) is selected for transmit and receive in the first mode.

Additionally, in the second mode, the first multi-throw switch 203 can be set to connect the antenna terminal to the second filter terminal, while the second multi-throw switch 204 can connect the second filter terminal to the transmit terminal or the receive terminal as needed for TDD operation. Thus, the second passband ($B_B$) is selected for transmit and receive in the second mode.

Furthermore, in the third mode, the first multi-throw switch 203 can be set to connect the antenna terminal to the second filter terminal, while the second multi-throw switch 204 can connect the first filter terminal to the transmit terminal or the receive terminal as needed for TDD operation. Thus, the stopband filter 207 is connected in series with the first bandpass filter 205 (with passband $B_A$) to effectively reduce the first bandpass filter's passband bandwidth in the third mode.

Additionally, in the fourth mode, the first multi-throw switch 203 can be set to connect the antenna terminal to the first filter terminal, while the second multi-throw switch 204 can connect the second filter terminal to the transmit terminal or the receive terminal as needed for TDD operation. Thus, the stopband filter 207 is connected in series with the second bandpass filter 206 (with passband $B_B$) to effectively reduce the second bandpass filter's passband bandwidth in the fourth mode.

By reconfiguring the switches, the band edges and a stopband within frequency extents can be made switch programmable and adjustable.

Figure 6C:
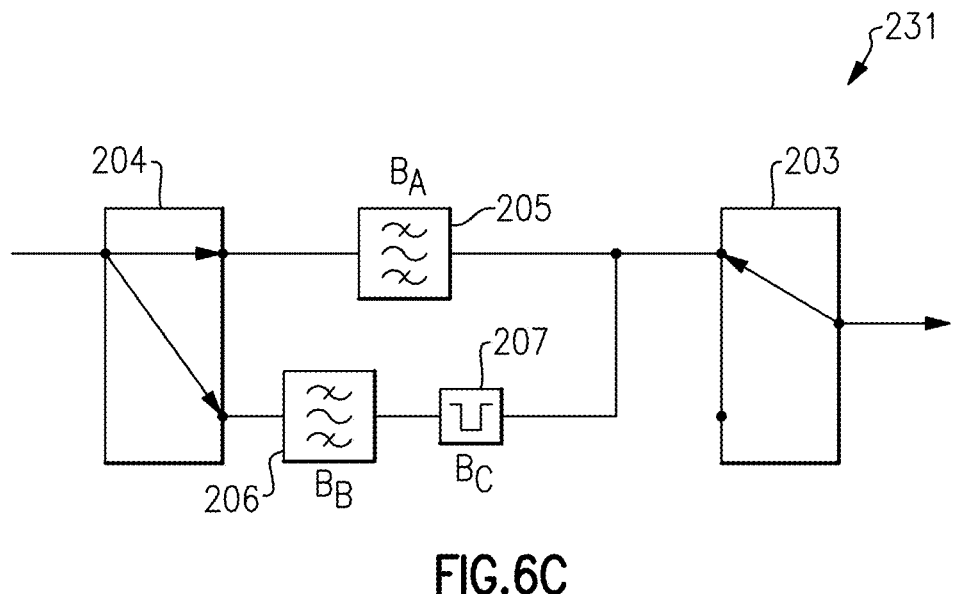
FIG. 6C is a schematic diagram of another mode of operation for the adjustable filter of FIG. 6A.
Figure 6D:
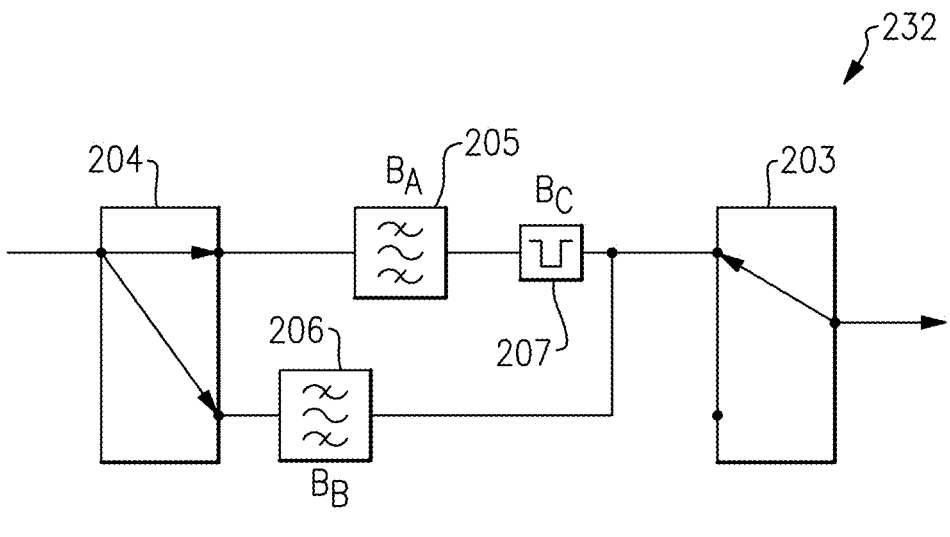
FIG. 6D is a schematic diagram of yet another mode of operation for the adjustable filter of FIG. 6A.

FIG. 6C is a schematic diagram of a fifth mode 231 of operation for the adjustable filter 200 of FIG. 6A. FIG. 6D is a schematic diagram of a sixth mode 232 of operation for the adjustable filter 200 of FIG. 6A.

In certain implementations, the switches 203/204 are further configurable such that the stopband filter 207 is: (5) switched in series with the second bandpass filter 206 (with passband $B_B$) and connected in duplex with first bandpass filter 205 (with passband $B_A$) in the fifth mode 231; and (6) switched in series with the first bandpass filter 205 (with passband $B_A$) and connected in duplex with the second bandpass filter 206 (with passband $B_B$) in the sixth mode 232. Thus, in both the fifth and sixth modes, a type of extractor is formed of two pass bands separated by a stopband.

To operate in the fifth mode 231, the first multi-throw switch 203 can be set to connect the antenna terminal to the first filter terminal, while the second multi-throw switch 204 can connect both the first filter terminal and the second filter terminal to the transmit terminal or the receive terminal as needed for TDD operation. Thus, the first bandpass filter 205 is in parallel with the series combination of the stopband filter 207 and the second bandpass filter 206 in the fifth mode 231.

Additionally, to operate in the sixth mode 232, the first multi-throw switch 203 can be set to connect the antenna terminal to the second filter terminal, while the second multi-throw switch 204 can connect both the first filter terminal and the second filter terminal to the transmit terminal or the receive terminal as needed for TDD operation. Thus, the second bandpass filter 206 is in parallel with the series combination of the stopband filter 207 and the first bandpass filter 205 in the sixth mode 232.

Figure 7A:
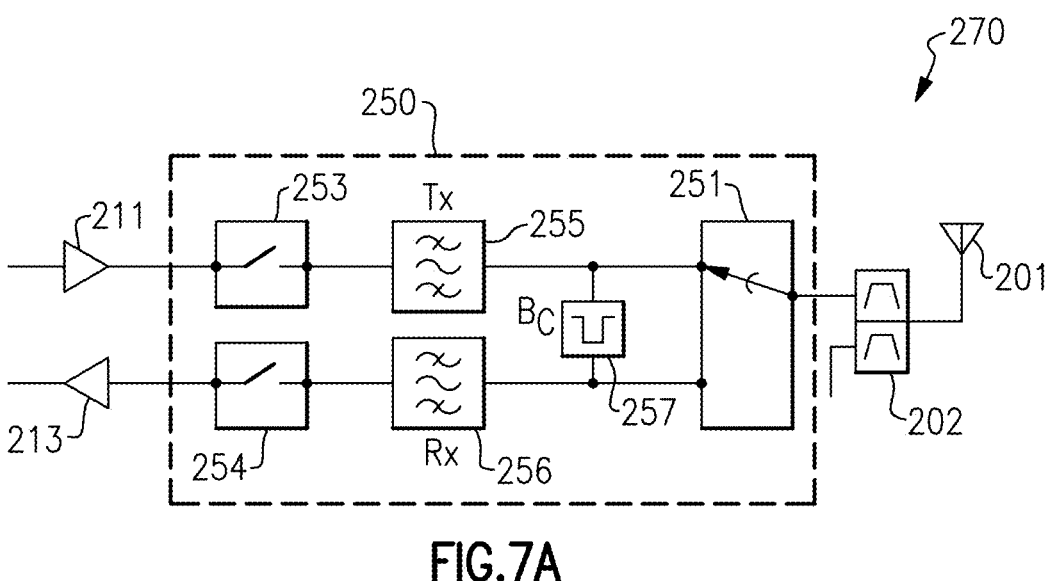
FIG. 7A is a schematic diagram of a front-end system with an adjustable filter according to another embodiment.

FIG. 7A is a schematic diagram of a front-end system 270 according to another embodiment. The front-end system 270 is coupled to an antenna 201, and includes an adjustable filter 250, an antenna-plexer 202 (implemented as a diplexer, in this example), a power amplifier 211, and an LNA 213. The front-end system 270 operates using FDD.

The adjustable filter 250 includes a first multi-throw switch 251 (also referred to as an antenna switch or ASM), a transmit switch 253, a receive switch 254, a first bandpass filter 255 with a first passband (Tx), a second bandpass filter 256 with a second passband (Rx), and a stopband filter 257 with a stopband ($B_C$). In certain implementations the first passband (Tx) and the second passband (Rx) include a frequency overlap region, which the stopband ($B_C$) overlaps.

In the illustrated embodiment, the first multi-throw switch 251 includes an antenna terminal for connecting to the antenna 201. The first multi-throw switch 251 also includes a first filter terminal and a second filter terminal that can be connected to the antenna terminal based on a state of the first multi-throw switch 251.

The transmit switch 253 includes a transmit terminal for connecting to an output of the power amplifier 211, and a filter terminal. Although only one transmit terminal is depicted, in certain implementations multiple transmit terminals are provided for connecting to the outputs of other power amplifiers. The receive switch 254 includes a receive terminal for connecting to an input of the LNA 213, and a filter terminal. Although only one receive terminal is depicted, in certain implementations multiple receive terminals are provided for connecting to the inputs of other LNAs.

As shown in FIG. 7A, the stopband filter 257 is connected between the first filter terminal and the second filter terminal of the first multi-throw switch 251. Additionally, the first bandpass filter 255 is connected between the first filter terminal of the first multi-throw switch 251 and the filter terminal of the transmit switch 253. Furthermore, the second bandpass filter 256 is connected between the second filter terminal of the first multi-throw switch 251 and the filter terminal of the receive switch 254.

The depicted configuration of filters and switches enables FDD operation in which the adjustable filter 250 can adjust the duplex gap between transmit and receive passband edges to enable n-plexing (also referred to as multiplexing).

In certain implementations, the switches 251/253/254 are configured such that the stopband filter 257 can be: (1) placed in series with the first bandpass filter 255 (with passband Tx) in the transmit path and not present in the receive path in a first mode; or (2) placed in series with the second bandpass filter 256 (with passband Rx) in the receive path and not present in the transmit path in a second mode.

Figure 7B:
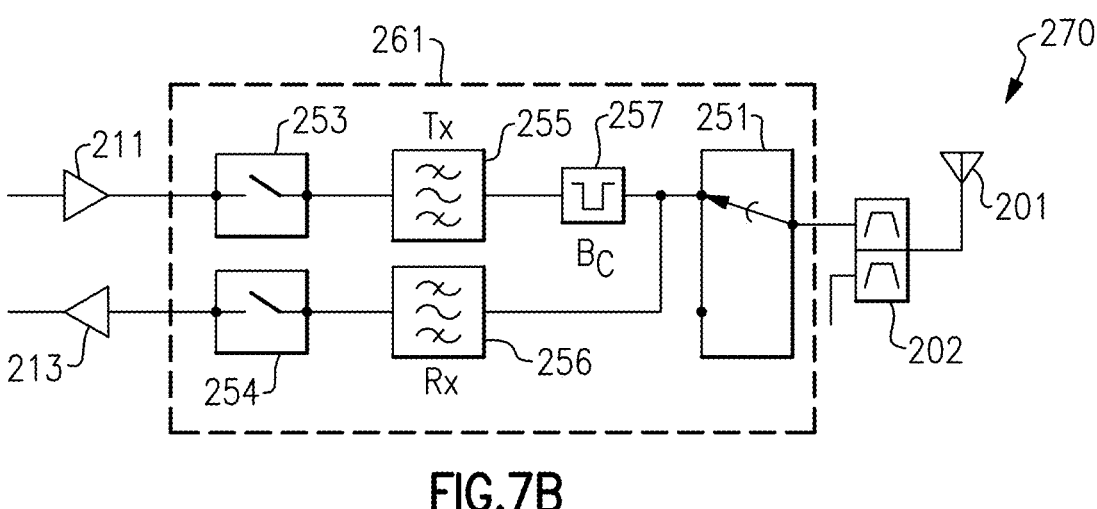
FIG. 7B is a schematic diagram of a first mode of operation for the adjustable filter of FIG. 7A.

For example, FIG. 7B is a schematic diagram of the first mode 261 of operation for the adjustable filter 250 of FIG. 7A. As shown in FIG. 7B, the first multi-throw switch 251 selects the first filter terminal in the first mode.

Figure 7C:
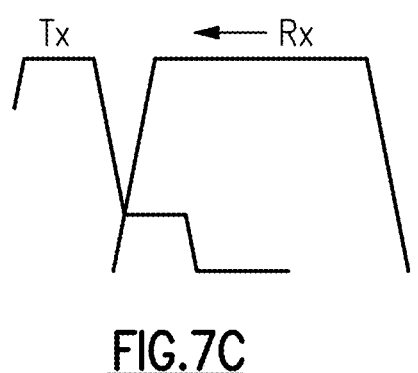
FIG. 7C is one example of a gain versus frequency diagram for the first mode of operation of FIG. 7B.

FIG. 7C is one example of a gain versus frequency diagram for the first mode 261 of operation of FIG. 7B. As shown in FIG. 7C, the passband Tx is attenuated by the stopband filter 257 in the first mode.

With reference to FIGS. 7B and 7C, the first mode 261 demonstrates an example configuration for the Tx passband below the Rx passband, with the full passband Rx filter 256 to connect to the ASM 251, while the Tx filter 255 is configured to also go through the $B_C$ stopband filter 257. As a result, the Tx passband is reduced, and the Tx upper band edge is lowered in frequency, and high attenuation switch-combining is enabled with in this configuration.

Figure 7D:
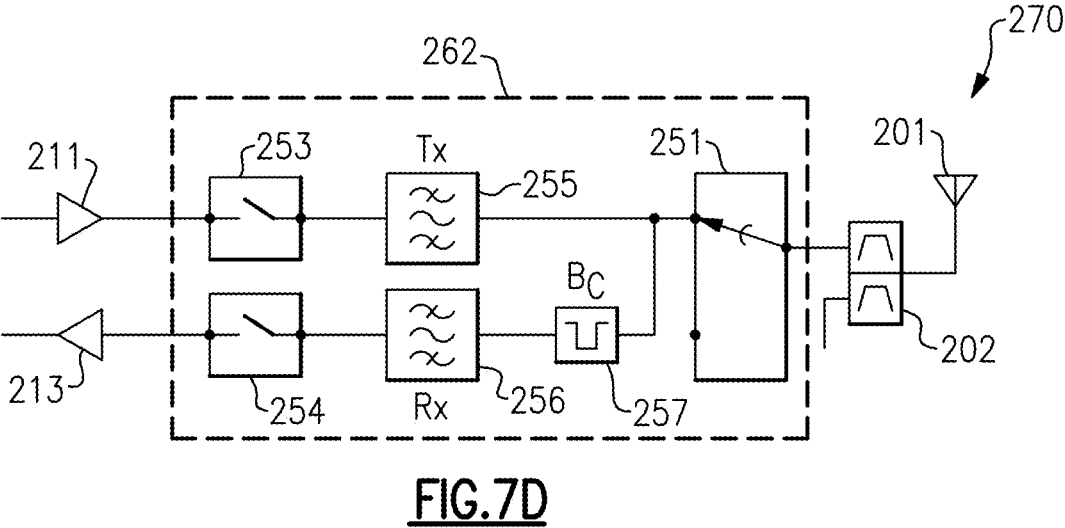
FIG. 7D is a schematic diagram of a second mode of operation for the adjustable filter of FIG. 7A.

FIG. 7D is a schematic diagram of a second mode 262 of operation for the adjustable filter 250 of FIG. 7A. As shown in FIG. 7D, the first multi-throw switch 251 selects the second filter terminal in the second mode.

Figure 7E:
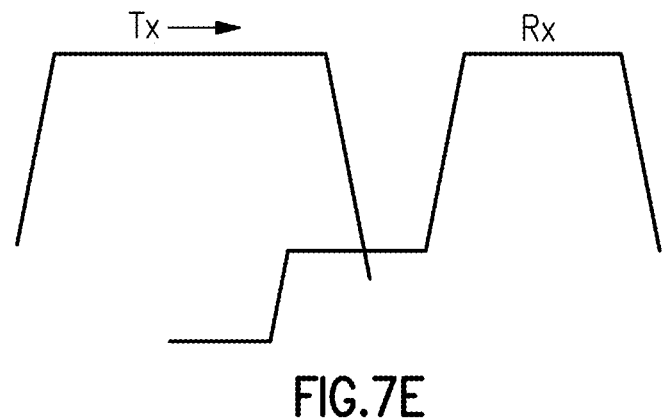
FIG. 7E is one example of a gain versus frequency diagram for the second mode of operation of FIG. 7D.

FIG. 7E is one example of a gain versus frequency diagram for the second mode 262 of operation of FIG. 7D. As shown in FIG. 7E, the passband Rx is attenuated by the stopband filter 257 in the second mode.

With reference to FIGS. 7D and 7E, the second mode 262 demonstrates an example configuration for Tx passband below Rx passband, with the full passband Tx filter 255 to connect to the ASM 251, while the Rx filter 256 is configured to also go through the $B_C$ stopband filter 257. As a result, the Rx passband is reduced, and the Rx lower band edge is raised in frequency, and high attenuation switch-combining is enabled with in this configuration.

Figure 8A:
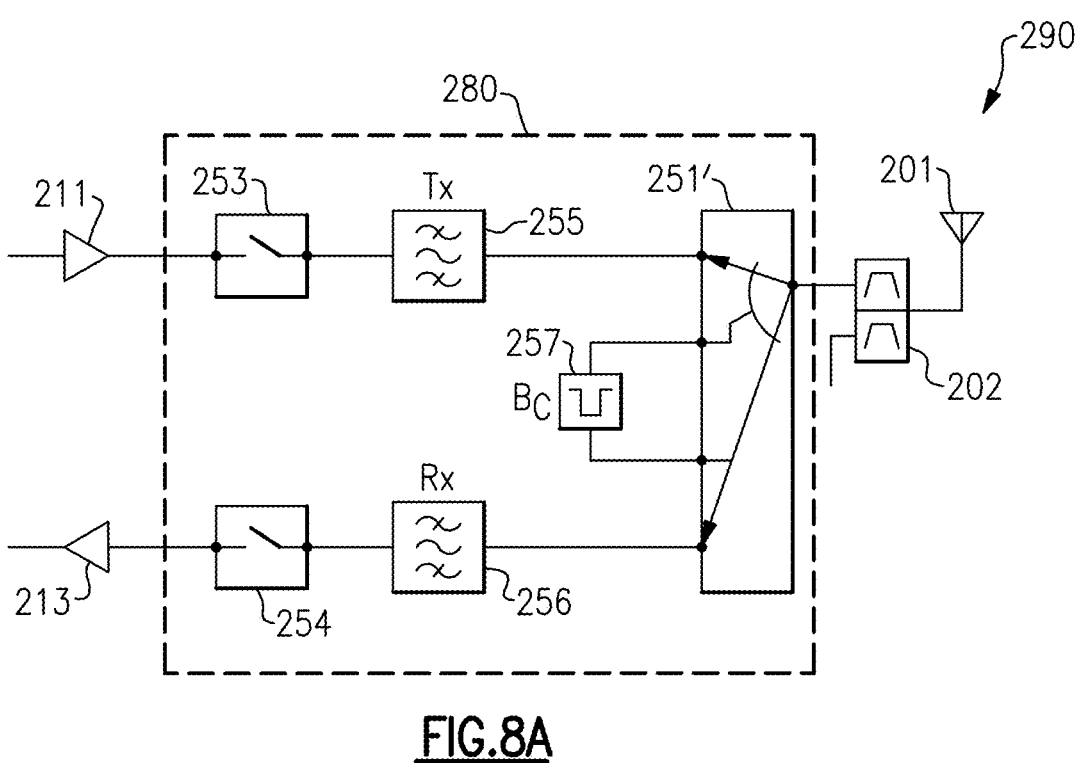
FIG. 8A is a schematic diagram of a front-end system with an adjustable filter according to another embodiment.

FIG. 8A is a schematic diagram of a front-end system 290 with an adjustable filter 280 according to another embodiment. The front-end system 290 of FIG. 8A is similar to the front-end system 270 of FIG. 7A, except that the adjustable filter 280 of FIG. 8A includes an antenna switch 251' with additional switching to either connect in (or not) the stopband filter 257.

In certain implementations, one or more switchable shunt inductors at common points of the duplex filter are included. These switchable shunt inductors can be switched in (or not) and in certain implementations have a programmable value to further enhance multiplexer performance. The switchable shunt inductors can be included at a variety of nodes, including, but not limited to, the first filter terminal and/or the second filter terminal of the first multi-throw switch 251/251'.

Figure 8B:
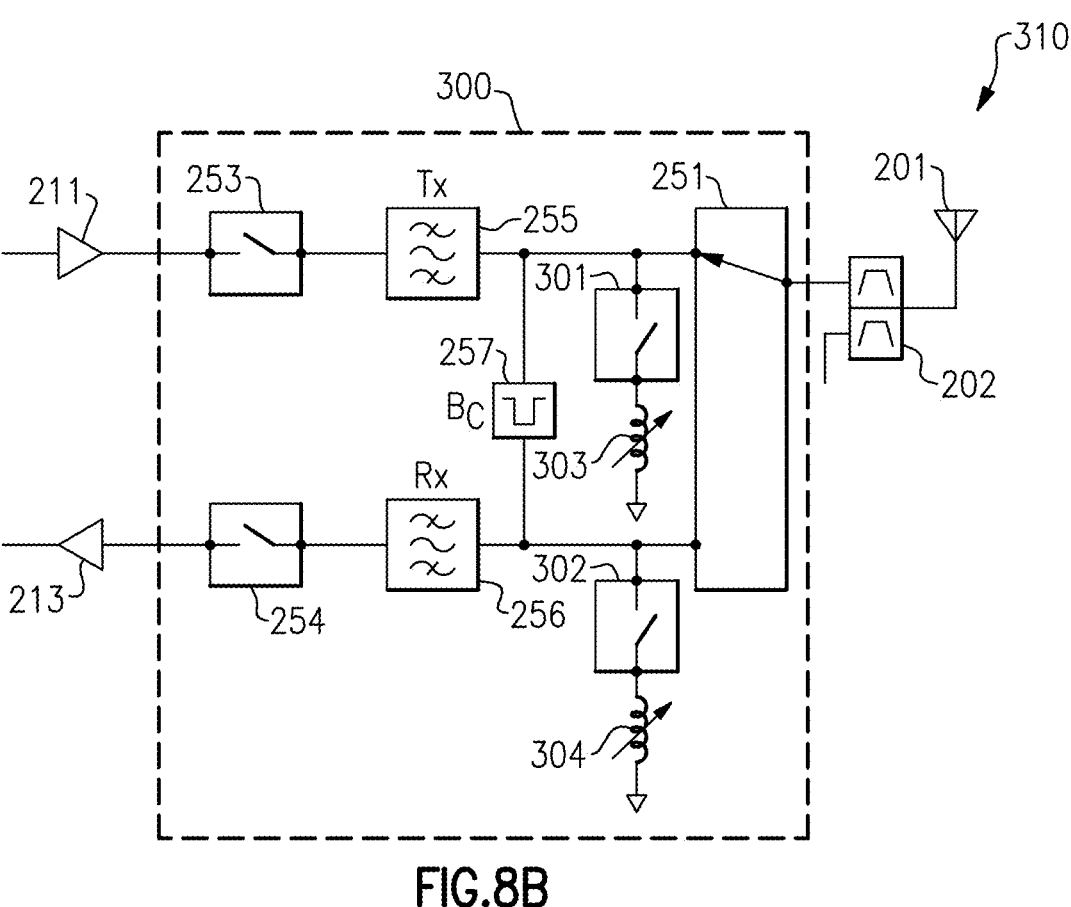
FIG. 8B is a schematic diagram of a front-end system with an adjustable filter according to another embodiment.

FIG. 8B is a schematic diagram of a front-end system 310 with an adjustable filter 300 according to another embodiment. The front-end system 310 of FIG. 8B is similar to the front-end system 270 of FIG. 7A, except that the adjustable filter 300 of FIG. 8B further includes a first switch 301, a first controllable inductor 303, a second switch 302, and a second controllable inductor 304.

As shown in FIG. 8B, the first switch 301 and the first controllable inductor 303 are in series between the first filter terminal and ground to provide a first switchable shunt inductor. Additionally, the second switch 302 and the second controllable inductor 304 are in series between the second filter terminal and ground to provide a second switchable shunt inductor.

The capacitance values of the first controllable inductor 303 and the second controllable inductor 304 are controllable, in this embodiment.

Figure 9:
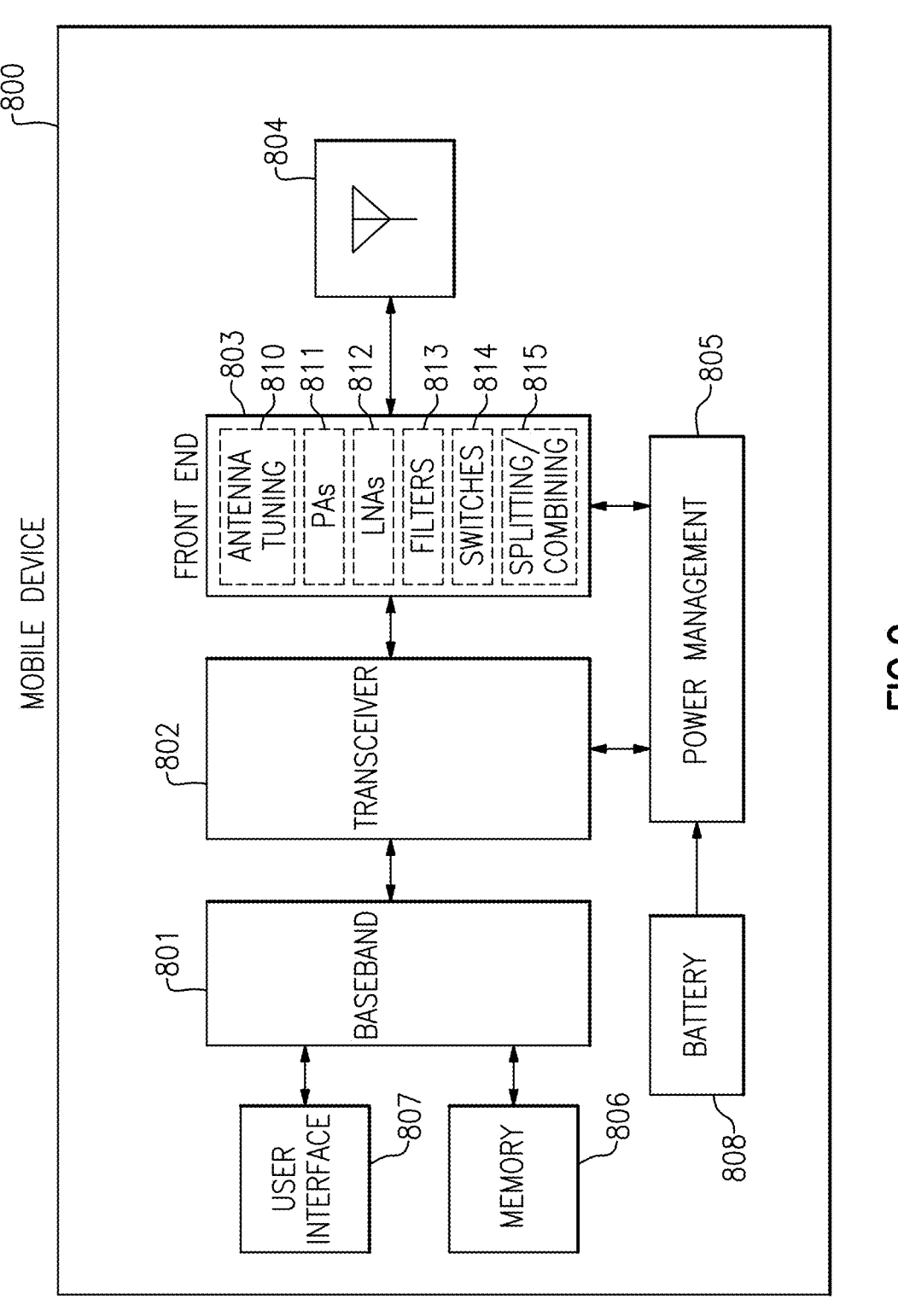
FIG. 9 is a schematic diagram of one embodiment of a mobile device.

FIG. 9 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 9 as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 9, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 9, the power management system 805 receives a battery voltage from the battery 808. The battery 808 can be any suitable battery for use in the mobile device 800, including, for example, a lithium-ion battery.

Applications

Some of the embodiments described above have provided examples in connection with mobile devices. However, the principles and advantages of the embodiments can be used for a wide range of RF communication systems. Examples of such RF communication systems include, but are not limited to, mobile phones, tablets, base stations, network access points, customer-premises equipment (CPE), laptops, and wearable electronics.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:

an antenna; and a front-end system including an adjustable filter, a power amplifier, and a low noise amplifier, the adjustable filter including a first multi-throw switch having an antenna terminal connected to the antenna and a second multi-throw switch having a transmit terminal connected to an output of the power amplifier and a receive terminal connected to an input of the low noise amplifier, the adjustable filter further including a first bandpass filter connected between a first filter terminal of the first multi-throw switch and a first filter terminal of the second multi-throw switch, a second bandpass filter connected between a second filter terminal of the first multi-throw switch and a second filter terminal of the second multi-throw switch, and a stopband filter connected between the first filter terminal of the first multi-throw switch and the second filter terminal of the first multi-throw switch.

2. The mobile device of claim 1 wherein a first passband of the first bandpass filter overlaps a second passband of the second bandpass filter in a frequency overlap region.

3. The mobile device of claim 2 wherein a stopband of the stopband filter at least partially overlaps the frequency overlap region.

4. The mobile device of claim 1 wherein a state of the second multi-throw switch is operable to control signal transmission or reception for time-division duplexing.

5. The mobile device of claim 1 wherein the adjustable filter is operable in a first mode in which the first multi-throw switch selects the first filter terminal and the second multi-throw switch selects the first filter terminal, and a second mode in which the first multi-throw switch selects the second filter terminal and the second multi-throw switch selects the second filter terminal.

6. The mobile device of claim 5 wherein the adjustable filter is operable in a third mode in which the first multi-throw switch selects the second filter terminal and the second multi-throw switch selects the first filter terminal, and a fourth mode in which the first multi-throw switch selects the first filter terminal and the second multi-throw switch selects the second filter terminal.

7. The mobile device of claim 6 wherein the adjustable filter is operable in a fifth mode in which the first multi-throw switch selects the first filter terminal and the second multi-throw switch selects both the first filter terminal and the second filter terminal, and a sixth mode in which the first multi-throw switch selects the second filter terminal and the second multi-throw switch selects both the first filter terminal and the second filter terminal.

8. A method of adjustable filtering in a mobile device, the method comprising:

providing a transmit signal from an output of a power amplifier to an antenna by way of an adjustable filter;

receiving a receive signal from an antenna at an input of a low noise amplifier by way of the adjustable filter;

controlling a state of a first multi-throw switch of the adjustable filter that is connected to the antenna, the adjustable filter including a first bandpass filter connected to a first filter terminal of the first multi-throw switch, a second bandpass filter connected to a second filter terminal of the first multi-throw switch, and a stopband filter connected between the first filter terminal and the second filter terminal; and controlling a state of a second multi-throw switch of the adjustable filter, the second multi-throw switch having a first filter terminal connected to the first bandpass filter, a second filter terminal connected to the second bandpass filter, a transmit terminal connected to an output of the power amplifier, and a receive terminal connected to an input of the low noise amplifier.

9. The method of claim 8 wherein a first passband of the first bandpass filter overlaps a second passband of the second bandpass filter in a frequency overlap region.

10. The method of claim 8 further comprising controlling a state of the second multi-throw switch to control signal transmission or reception for time-division duplexing.

11. The method of claim 8 further comprising operating the adjustable filter in a first mode in which the first multi-throw switch selects the first filter terminal and the second multi-throw switch selects the first filter terminal, and operating the adjustable filter in a second mode in which the first multi-throw switch selects the second filter terminal and the second multi-throw switch selects the second filter terminal.

12. The method of claim 11 further comprising operating the adjustable filter in a third mode in which the first multi-throw switch selects the second filter terminal and the second multi-throw switch selects the first filter terminal, and operating the adjustable filter in a fourth mode in which the first multi-throw switch selects the first filter terminal and the second multi-throw switch selects the second filter terminal.

13. The method of claim 12 further comprising operating the adjustable filter in a fifth mode in which the first multi-throw switch selects the first filter terminal and the second multi-throw switch selects both the first filter terminal and the second filter terminal, and operating the adjustable filter in a sixth mode in which the first multi-throw switch selects the second filter terminal and the second multi-throw switch selects both the first filter terminal and the second filter terminal.

14. A front-end system comprising:

a power amplifier having an output;

a low noise amplifier having an input; and an adjustable filter including a first multi-throw switch having an antenna terminal for connecting to an antenna and a second multi-throw switch having a transmit terminal connected to the output of the power amplifier and a receive terminal connected to the input of the low noise amplifier, the adjustable filter further including a first bandpass filter connected between a first filter terminal of the first multi-throw switch and a first filter terminal of the second multi-throw switch, a second bandpass filter connected between a second filter terminal of the first multi-throw switch and a second filter terminal of the second multi-throw switch, and a stopband filter connected between the first filter terminal of the first multi-throw switch and the second filter terminal of the first multi-throw switch.

15. The front-end system of claim 14 wherein a first passband of the first bandpass filter overlaps a second passband of the second bandpass filter in a frequency overlap region.

16. The front-end system of claim 15 wherein a stopband of the stopband filter at least partially overlaps the frequency overlap region.

17. The front-end system of claim 14 wherein a state of the second multi-throw switch is operable to control signal transmission or reception for time-division duplexing.

18. The front-end system of claim 14 wherein the adjustable filter is operable in a first mode in which the first multi-throw switch selects the first filter terminal and the second multi-throw switch selects the first filter terminal, and a second mode in which the first multi-throw switch selects the second filter terminal and the second multi-throw switch selects the second filter terminal.

19. The front-end system of claim 18 wherein the adjustable filter is operable in a third mode in which the first multi-throw switch selects the second filter terminal and the second multi-throw switch selects the first filter terminal, and a fourth mode in which the first multi-throw switch selects the first filter terminal and the second multi-throw switch selects the second filter terminal.

20. The front-end system of claim 19 wherein the adjustable filter is operable in a fifth mode in which the first multi-throw switch selects the first filter terminal and the second multi-throw switch selects both the first filter terminal and the second filter terminal, and a sixth mode in which the first multi-throw switch selects the second filter terminal and the second multi-throw switch selects both the first filter terminal and the second filter terminal.

* * * * *